(12) United States Patent
Dang et al.

(10) Patent No.: US 7,939,896 B2
(45) Date of Patent: May 10, 2011

(54) SOI SUBSTRATE CONTACT WITH EXTENDED SILICIDE AREA

(75) Inventors: Dinh Dang, Essex Junction, VT (US); Thai Doan, Burlington, VT (US); Jessica Anne Levy, Milton, VT (US); Max Gerald Levy, Essex Junction, VT (US); Alan Frederick Norris, Fairfax, VT (US); James Albert Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/613,631

(22) Filed: Nov. 6, 2009

(65) Prior Publication Data

US 2010/0084736 A1 Apr. 8, 2010

Related U.S. Application Data

(62) Division of application No. 11/868,564, filed on Oct. 8, 2007, now Pat. No. 7,675,121.

(51) Int. Cl.
*H01L 29/78* (2006.01)
(52) U.S. Cl. ........ 257/377; 257/412; 257/413; 257/347; 257/774; 257/E29.156
(58) Field of Classification Search .............. 257/377, 257/382, 383, 412, 413, 347, 774, E29.156
See application file for complete search history.

(56) References Cited

U.S. PATENT DOCUMENTS

| | | | |
|---|---|---|---|
| 5,162,259 A | 11/1992 | Kolar et al. | |
| 5,314,841 A | 5/1994 | Brady et al. | |
| 6,352,882 B1 | 3/2002 | Assaderaghi | |
| 6,372,563 B1 | 4/2002 | Krivokapic et al. | |
| 6,498,372 B2 * | 12/2002 | Brown et al. | 257/355 |
| 6,521,947 B1 | 2/2003 | Ajmera et al. | |
| 6,603,166 B2 | 8/2003 | Fechner et al. | |
| 7,053,453 B2 | 5/2006 | Tsao et al. | |
| 7,274,065 B2 | 9/2007 | Helm et al. | |
| 7,335,553 B2 * | 2/2008 | Su et al. | 438/243 |
| 2004/0106247 A1 * | 6/2004 | Takahashi | 438/198 |
| 2004/0241917 A1 | 12/2004 | Schwan et al. | |
| 2005/0176184 A1 | 8/2005 | Okihara | |
| 2005/0269642 A1 | 12/2005 | Minami | |
| 2008/0017906 A1 | 1/2008 | Pelella et al. | |

OTHER PUBLICATIONS

Notice of Allowance (Mail date Oct. 16, 2009) for U.S. Appl. No. 11/868,564, filed Oct. 8, 2007, Confirmation No. 1328.
Notice of Allowance (Mail Date Sep. 17, 2009) for U.S. Appl. No. 11/868,553, filed Oct. 8, 2007, Confirmation No. 1302.

\* cited by examiner

*Primary Examiner* — Tan N Tran
(74) *Attorney, Agent, or Firm* — Schmeiser, Olsen & Watts; David Cain

(57) ABSTRACT

A low resistance contact structure and method of making the structure. The structure includes a polysilicon contact through an upper silicon layer and buried oxide layer to a lower silicon layer of a silicon-on-insulation substrate. A region of the upper silicon layer surrounds the polysilicon contact and top surface of the polysilicon contact and surrounding region of upper silicon layer are metal silicided providing an extended contact area greater than the area of the top surface of polysilicon contact.

10 Claims, 11 Drawing Sheets

SOI SUBSTRATE CONTACT WITH EXTENDED SILICIDE AREA

This application is a division of application Ser. No. 11/868,564 filed Oct. 8, 2007 now U.S. Pat. No. 7,675,121. This Application is related to application Ser. No. 11/868,553 filed on Oct. 8, 2007 entitled "SOI SUBSTRATE CONTACT WITH EXTENDED SILICIDE AREA"

FIELD OF THE INVENTION

The present invention relates to the field of integrated circuit devices and methods of fabricating integrated circuit devices; more specifically, it relates to structures for a substrate contacts for use in SOI substrates and the method of fabricating the substrate contacts.

BACKGROUND OF THE INVENTION

In modern integrated circuits it advantageous to form contacts from the front surface into to substrate itself. In SOI wafers this means contacting the layer under the buried oxide layer from the upper layer. However, existing fabrication techniques for substrate contacts require precise lithography and can result in higher contact resistances than would be desired. Accordingly, there exists a need in the art to overcome the deficiencies and limitations described hereinabove.

SUMMARY OF THE INVENTION

A first aspect of the present invention is a structure, comprising: dielectric isolation in an upper silicon layer of a substrate, the substrate comprising a buried oxide layer between the upper silicon layer and a lower silicon layer, the dielectric isolation extending from a top surface of the upper silicon layer to the buried oxide layer, the dielectric isolation surrounding a perimeter of contact region of the upper silicon layer; a polysilicon region extending through the contact region and through the buried oxide layer to the lower silicon layer, portions of the contact region remaining between the polysilicon region and the dielectric isolation, the polysilicon region doped a same dopant type as the lower silicon layer; and a contiguous metal silicide layer in remaining portions of the contact region and the polysilicon region, the metal silicide layer extending from a top surface of the polysilicon region into the polysilicon region and extending from a top surface of the remaining portions of the contact region into the remaining portions of the contact region.

A second aspect of the present invention is the first aspect, further including: an enhanced contact region in the lower silicon layer, abutting a bottom of the polysilicon region, the enhanced contact region doped the same dopant type as the lower silicon layer.

A third aspect of the present invention is the second aspect, wherein a polysilicon region/lower silicon layer interface has a resistivity of about 0.05 or less.

A fourth aspect of the present invention is the first aspect, further including: a top surface of the polysilicon region recessed below a top surface of the dielectric isolation.

A fifth aspect of the present invention is the first aspect, wherein the lower silicon layer and the upper silicon layer are doped P-type.

A sixth aspect of the present invention is the first aspect, wherein a width of the contact region measured in a direction parallel to a top surface of the upper silicon layer is less than a width of the contact region measured in the direction.

A seventh aspect of the present invention is the first aspect, wherein a ratio of a total thickness of the upper silicon layer and the buried oxide layer measured in a direction perpendicular to the top surface of the upper silicon layer to a width of the polysilicon region measured in a direction perpendicular to the top surface of the upper silicon layer is equal to or greater than about 3.

An eighth second aspect of the present invention is the first aspect, wherein the polysilicon region does not physically contact the dielectric isolation.

A ninth aspect of the present invention is the first aspect, wherein at least a portion of the contact region intervenes between the dielectric isolation and the polysilicon region.

A tenth aspect of the present invention is the first aspect, wherein the contact region is in the form of a first ring surrounded by the dielectric isolation and the polysilicon region is in the form of a second ring within the first ring.

An eleventh aspect of the present invention is a structure, comprising: a dielectric isolation in an upper silicon layer of a substrate, the substrate comprising a buried oxide layer between the upper silicon layer and a lower silicon layer, the dielectric isolation extending from a top surface of the upper silicon layer to the buried oxide layer, the dielectric isolation surrounding a perimeter of a contact region of the upper silicon layer and surrounding a perimeter of a device region of the upper silicon layer; a polysilicon region extending through the contact region and through the buried oxide layer to the lower silicon layer, portions of the contact region remaining between the polysilicon region and the dielectric isolation; a gate dielectric layer between a gate electrode and a portion of the device region; source/drain regions of a same dopant type as the lower silicon layer in the device region on opposite sides of the gate electrode; and metal silicide layers in remaining portions of the contact region, the polysilicon region and the source/drain regions; the metal silicide layers extending from respective top surfaces of the polysilicon region into the polysilicon region, of the remaining portions of the contact region into the remaining portions of the contact region and of the source/drain regions into the source/drain regions, the metal silicide layers in the remaining portions of the contact region and the polysilicon region being contiguous.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The embodiments of present invention will be described for silicon-on-insulator (SOI) substrates where the silicon layers are initially doped P-type. The present invention is applicable to SOI substrates that are doped N-type by changing ion implant species in the various ion implantation steps described infra from P-type to N-type as indicated.

Figure 1A:
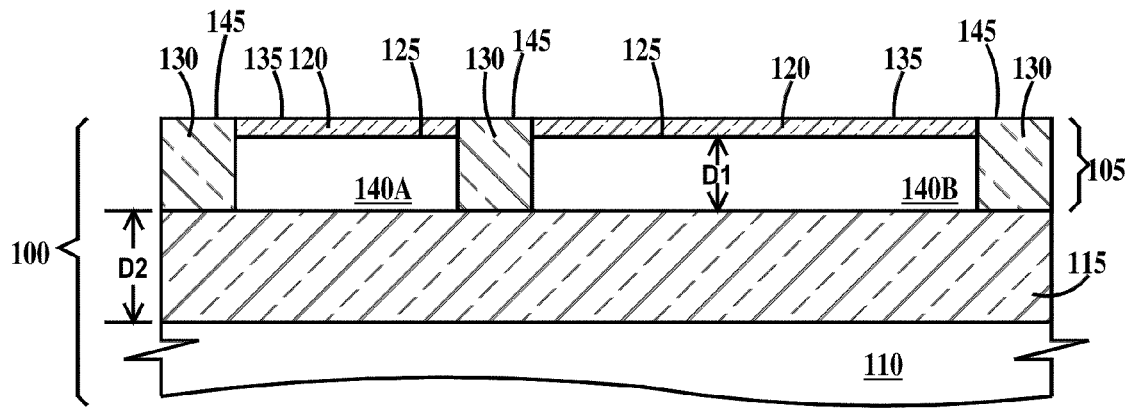
FIGS. 1A through 1L are cross-sectional views illustrating fabrication of substrate contacts according to the embodiments of the present invention.

FIGS. 1A through 1L are cross-sectional views illustrating fabrication of substrate contacts according to the embodiments of the present invention. In FIG. 1A, an SOI substrate 100 includes an upper silicon layer 105 separated from a lower silicon layer 110 by a buried oxide (BOX) layer 115. In one example, upper and lower silicon layers 105 and 110 are initially doped P-type prior to the start of any fabrication steps. Upper silicon layer 105 has a thickness D1. In one example, D1 is between about 0.1 micron and about 0.2 micron. BOX layer 115 has a thickness D2. In one example, D2 is between about 0.1 micron and about 1.0 micron. In one example, lower silicon layer 110 has a resistivity of between about 1 and about 200 ohm-cm. In one example, upper silicon layer is single-crystal silicon. In one example, lower silicon layer is single-crystal silicon. In one example, both upper and lower silicon layers are single-crystal silicon.

In a first fabrication step, a pad layer 120 is formed on a top surface of upper silicon layer 105. Pad layer 120 may comprise multiple layers. In one example, pad layer 120 comprises a layer of silicon dioxide on top surface 125 of upper silicon layer 105 and a silicon nitride layer on a top surface of the silicon oxide layer. Subsequent processing steps follow. A dielectric isolation 130 is formed in silicon layer 105. Dielectric isolation extends from a top surface 135 of pad layer 120, through upper silicon layer 105 to abut BOX layer 115. Dielectric isolation 130 separates upper silicon layer 105 in a first silicon region 140A and a second silicon region 140B. A p-channel field effect transistor (PFET) will be fabricated in second silicon region 140B, so second silicon region 140B is doped N-type, but first silicon region 140A remains P-type. If upper silicon layer 105 and lower silicon layer 115 were N-type, then an n-channel field effect transistor (NFET) will be fabricated in second silicon region 140B, so second silicon region 140B would be doped P-type, but first silicon region 140A would remain N-type. A top surface 145 of dielectric isolation is essentially co-planar with top surface 135 of pad layer 120. In one example, pad layer 120 is about 0.12 microns or less thick.

Other NFETs and PFETs are fabricated in other second regions 140B of the upper silicon layer 105, but the fabrication of those NFETs and PFETs are not illustrated in FIGS. 1A through 1K.

Figure 1B:
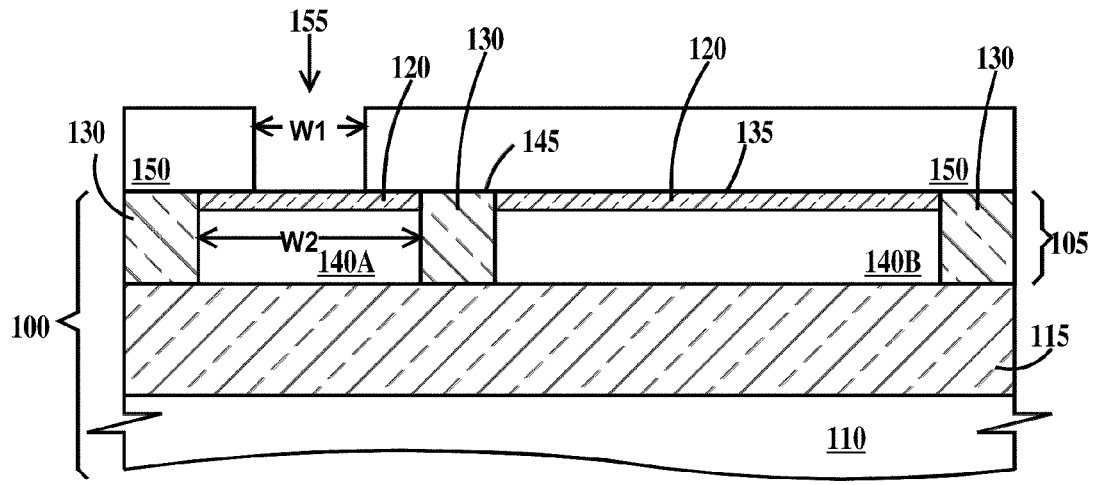

In FIG. 1B, a photoresist layer 150 is formed over top surface 135 of pad layer 120 and top surface 145 of dielectric isolation 130. An opening 155A is formed in photoresist layer 150 over first silicon region 140A in a photolithographic process, by exposing the photoresist layer to actinic radiation through a patterned photomask followed by developing away the exposed regions of the photoresist layer if photoresist layer comprises a positive photoresist or by developing away the unexposed regions of the photoresist layer if the photoresist layer comprises a negative photoresist. One of ordinary skill in the art will recognize that although not shown in FIG. 1B, various anti-reflective coatings may be applied under and various antireflective and/or protective topcoat layers may be applied over photoresist layer 150.

Opening 155A has a width W1 and first silicon region 140A has a width W2. W2 is significantly greater (e.g., at least 10% greater) than W1. In one example, W2 is about twice W1. Because W2 is significantly greater than W1, alignment of opening 155A to first silicon region 140A is considered a non-critical alignment (e.g., has greater value alignment tolerance specification than an alignment tolerance specification value for a critical alignment). Non-critical alignments can often be performed faster than critical alignments and there is often less yield/reliability loss associated with non-critical alignments than with critical alignments.

Figure 1C:
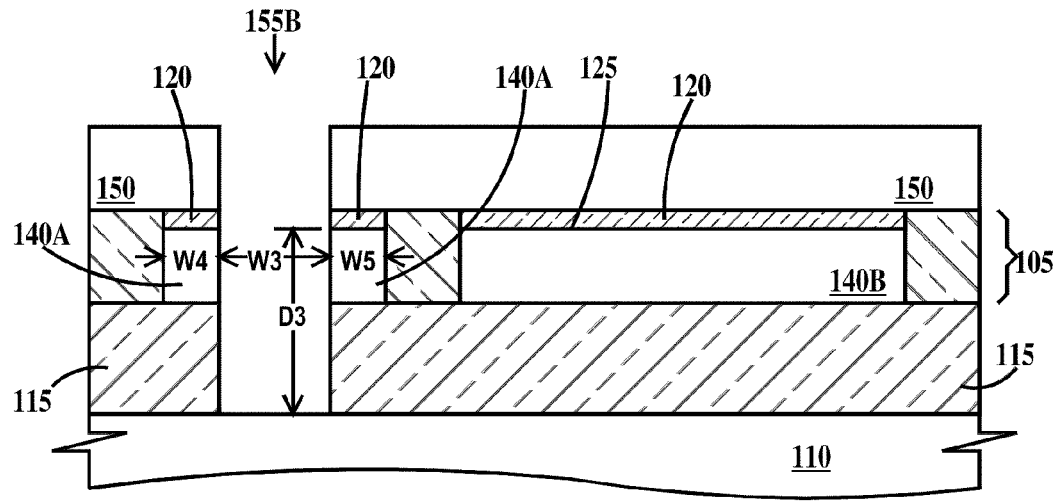

In FIG. 1C, a reactive ion etch (RIE) has been performed to extend opening 155A (see FIG. 1B) through pad layer 120, first silicon region 140A and BOX layer 115 to form an opening 155B and to expose lower silicon layer 110 in the bottom of opening 155B. Opening 155B has a depth D3 and a maximum width W3. D3 is about equal to D1+D2 (see FIG. 1A) or greater if opening extend into lower silicon layer 110. In one example, the ratio of D3 to W3 (D3 divided by W3) (see FIG. 1B) is about 3 or greater.

A width of first region of silicon region 140A on a first side of opening 155B is W4 and a width of a second region of silicon region 140A on a second and opposite side of opening 155B is W5. W3+W4+W5=W2 (see FIG. 1B). It is advantageous that neither W4 or W5 be zero.

Figure 1D:
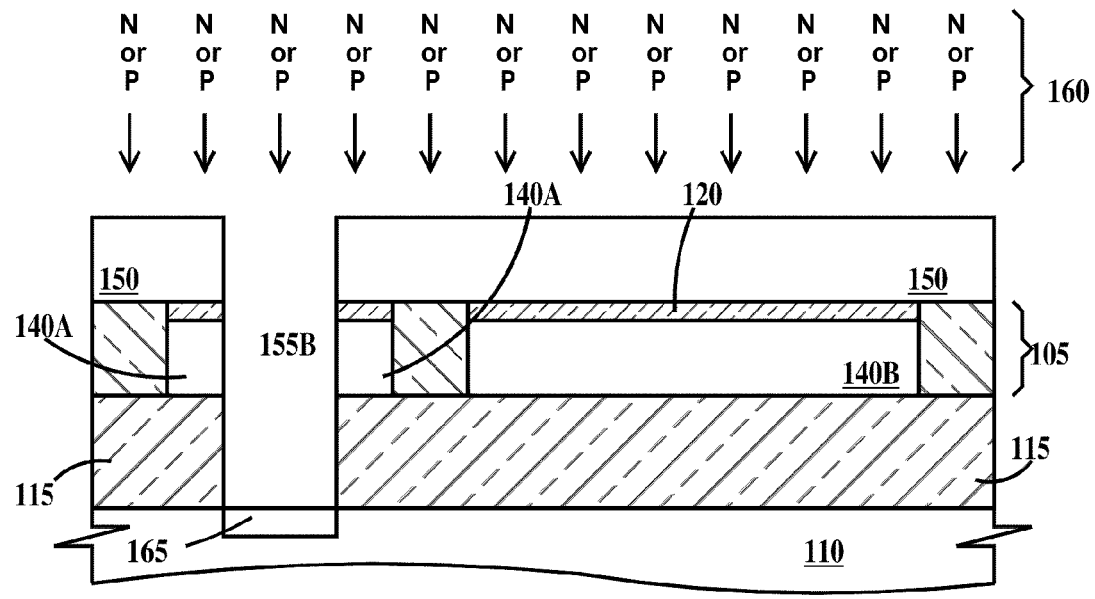

In FIG. 1D, an optional enhanced contact ion implantation 160 is performed to form an enhanced contact region 165 in lower silicon layer 110 at the bottom of opening 155B. The dose and energy of the enhanced contact ion implantation 160 is advantageously chosen to result in a resistivity of about 0.05 or less at the polysilicon 170/lower silicon layer 110 interface (see FIG. 1E). Photoresist layer 150 prevents implantation into second silicon region 140B. If substrate 110 is doped P-type, enhanced contact ion implantation 160 comprises P-type ions and enhanced contact region 165 is P-type. If substrate 110 is doped N-type, enhanced contact ion implantation 160 comprises N-type ions and enhanced contact region 165 is N-type. The greater the value of D2 (see FIG. 1A) or of D3 (see FIG. 1C) the more advantageous is the use of lower contact ion implant 160. The greater the resistivity of lower silicon layer 110, the more advantageous is the use of enhanced contact ion implantation 160. In one example, when lower silicon layer 110 is doped p-type, enhanced contact ion implantation 160 comprises implanting a boron containing species (e.g., $B^{11}$) at a dose of between about 5 E12 atoms/cm$^2$ and about 5 E14 atoms/cm$^2$. In one example, when lower silicon layer 110 is doped P-type, enhanced contact ion implantation 160 comprises implanting a boron containing species (e.g., $B^{11}$) at an energy of between about 3 to about 15 KeV. The ion implantation energy is advantageously chosen to provide an increased dopant concentration in lower silicon layer 110 under opening 155B then away from opening 155B. When lower silicon layer 110 is doped N-type, boron may be replaced with phosphorus and/or arsenic and the ion implantation energies adjusted for the higher mass of arsenic and phosphorus as compared to boron. The phosphorus and/or arsenic doses would be about the same as for boron.

Figure 1E:
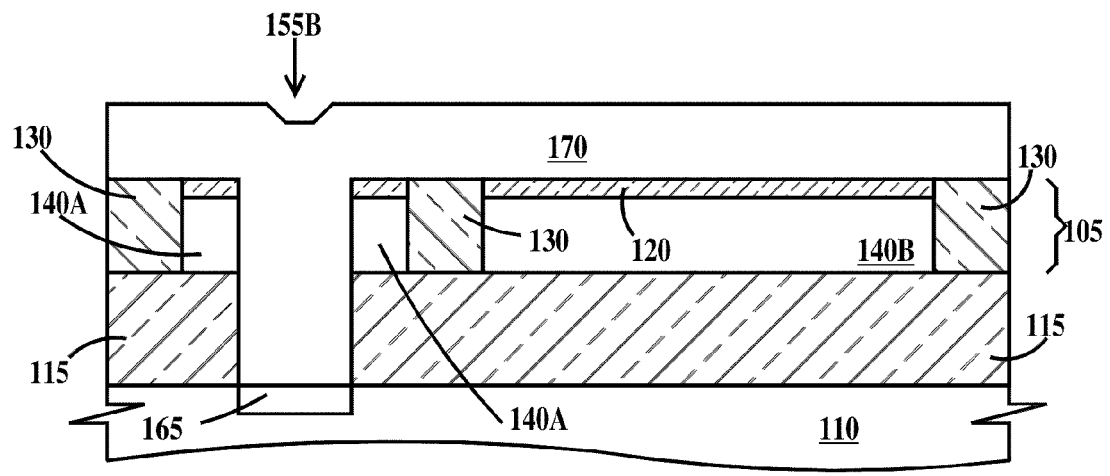

In FIG. 1E, a polysilicon layer 170 is deposited overfilling opening 155B and covering pad layer 120 and dielectric isolation 130. In one example, polysilicon layer 170 is undoped.

Figure 1F:
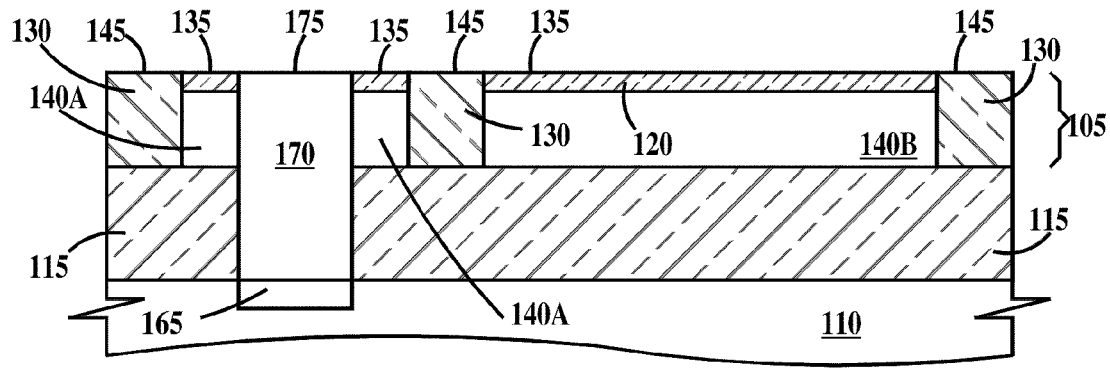

In FIG. 1F, a planarization process is performed to remove polysilicon layer 170 from over pad layer 120 and dielectric isolation 130. After the CMP, a top surface 175 of polysilicon layer 170 is substantially co-planar with top surface 135 of pad layer 120. Examples of planarization processes include chemical-mechanical-polish (CMP) and blanket RIE processes.

Figure 1G:
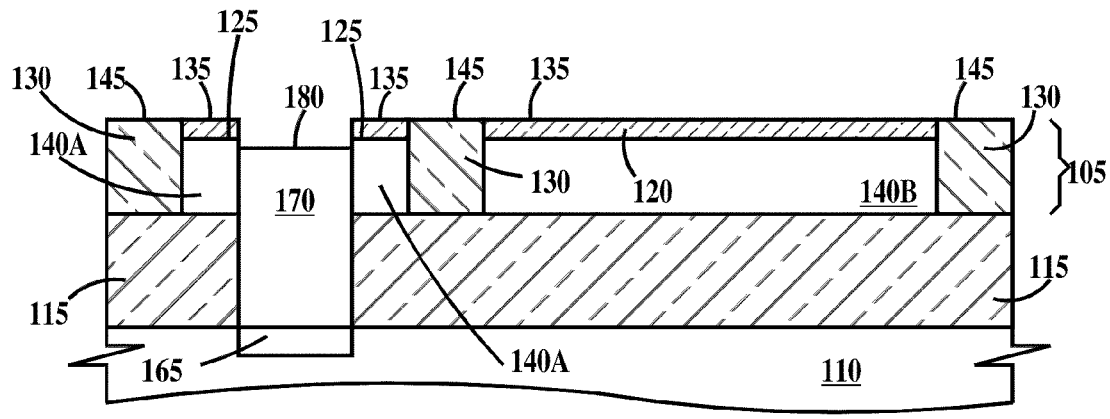

In FIG. 1G, an optional polysilicon recess etch is performed so a new top surface 180 of polysilicon layer 170 is recessed below top surface 135 of pad layer 135 or recessed below top surface 125 of upper silicon layer 105. In one example, the recess process includes an RIE. In one example the recess process includes a wet etch.

Figure 1H:
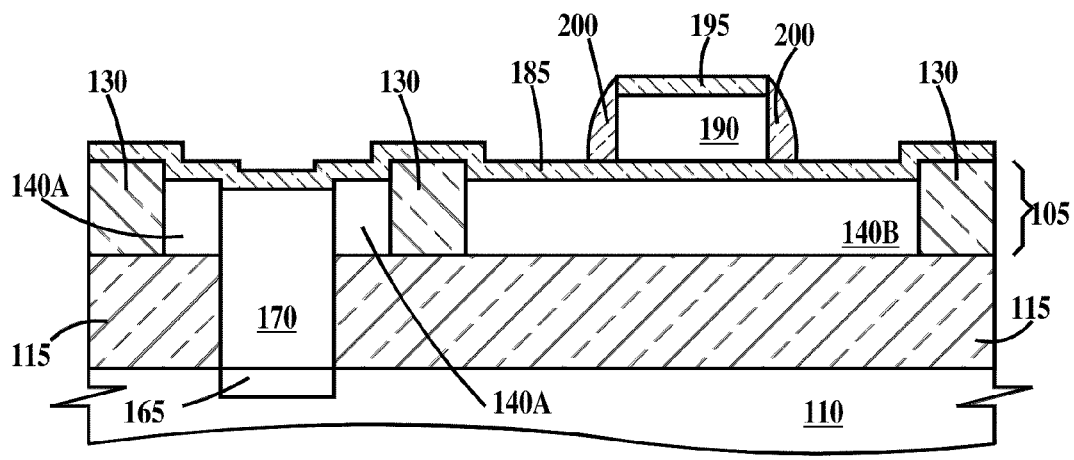

In FIG. 1H, pad layer 120 is removed and a gate dielectric layer 185 formed. In one example, the pad removal process includes a RIE. In one example the pad removal process includes a wet etch. Hydrofluoric acid containing solutions may be used to remove silicon dioxide and hot phosphoric acid may be used to remove silicon nitride. Gate dielectric layer 185 may be formed by thermal oxidation or by deposition. In FIG. 1H, gate dielectric layer 185 has been formed by deposition so the gate dielectric layer covers first and second silicon regions 140A and 140B, polysilicon layer 170 and dielectric isolation 130. If thermal oxidation were used, gate dielectric layer 185 would not be formed over dielectric isolation 130. Also in FIG. 1H, a gate electrode 190 is formed on gate dielectric layer 185, a dielectric capping layer 195 is formed on the top of the gate electrode and dielectric sidewall spacers 200 are formed on the sides of the gate electrode.

In one example, gate dielectric layer 185 comprises silicon dioxide. In one example, gate dielectric layer 185 comprises a layer of silicon nitride over a layer of silicon dioxide. In one example gate dielectric layer 185 is a high K (dielectric constant) material, examples of which include but are not limited metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$ or combinations of layers thereof. A high K dielectric material has a relative permittivity above about 10. In one example, gate dielectric layer 175 is about 0.5 nm to 20 nm thick.

Figure 1I:
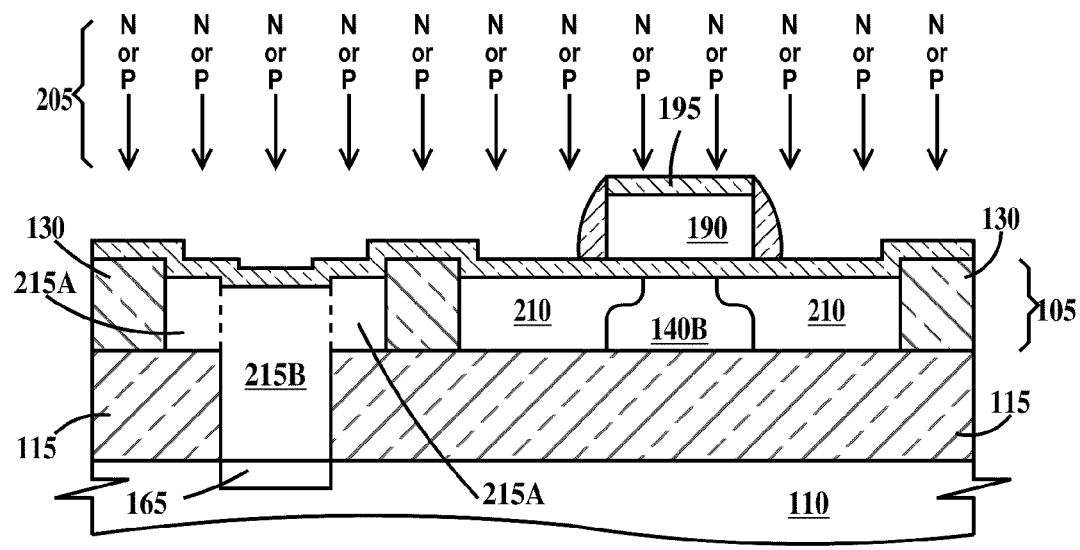

In FIG. 1I, a source/drain ion implantation 205 is performed to form source/drains 210 in second silicon region 140B and a doped contact region 215A in polysilicon layer 170 (see FIG. 1H) contiguous with a doped contact region 215B in first silicon region 140A (see FIG. 1H). If substrate 110 is doped P-type, ion implantation 205 comprises P-type ions and doped contact regions 215A and 215B are P-type. If substrate 110 is doped N-type, ion implantation 205 comprises N-type ions and doped contact regions 215A and 215B are N-type. In one example, when lower silicon layer 110 is doped p-type, ion implantation 205 comprises implanting a boron containing species (e.g., $B^{11}$) at a dose of between about 1 E15 atoms/cm² and about 1E16 atoms/cm². In one example, when lower silicon layer 110 is doped P-type, ion implantation 205 comprises implanting a boron containing species (e.g., $B^{11}$) at an energy of between about 3 to about 15 KeV. When lower silicon layer 110 is doped N-type, boron may be replaced with phosphorus and/or arsenic and the ion implantation energies adjusted for the higher mass of arsenic and phosphorus as compared to boron. The phosphorus and/or arsenic doses would be about the same as for boron.

Figure 1J:
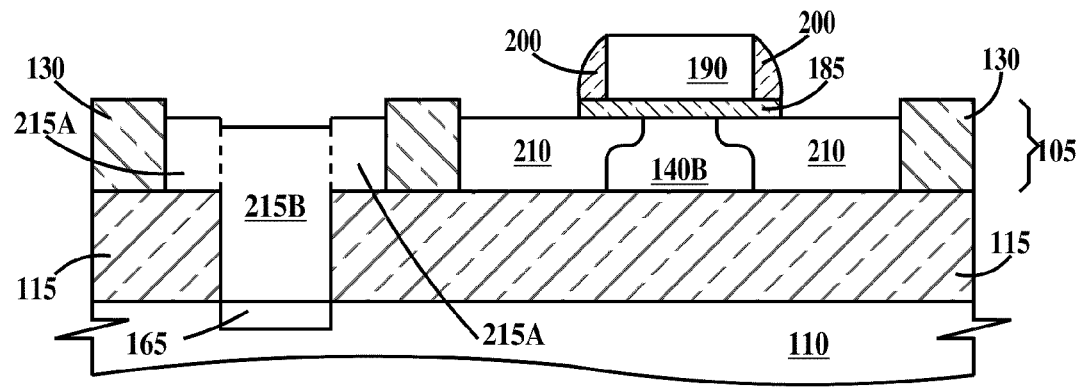

In FIG. 1J, source/drains 210 are illustrated as extending to BOX layer 115. Alternatively, source/drains 210 do not extend to BOX layer 115 and silicon region 140B extends under the source/drains.

In FIG. 1J, gate dielectric layer 185 not protected by gate electrode 190 or dielectric sidewall spacers 200 is removed by either RIE or wet etching. Dielectric capping layer 195 (see FIG. 1I) is also removed. If dielectric capping layer 195 is silicon nitride, hot phosphoric acid may be used to remove the dielectric capping layer.

Figure 1K:
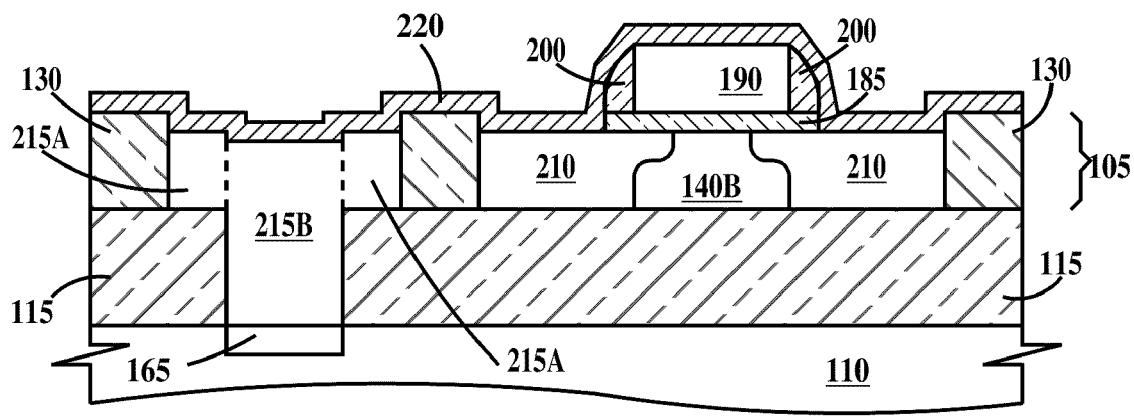

In FIG. 1K, a metal layer 220 is deposited over exposed surfaces if dielectric isolation 130, source/drains, the top surface of gate electrode 190, dielectric sidewall spacers 200, source/drains 210, and doped contact regions 215A and 215B. In one example, metal layer comprises a metal selected from the group consisting of cobalt, platinum, titanium, tungsten and nickel.

Figure 1L:
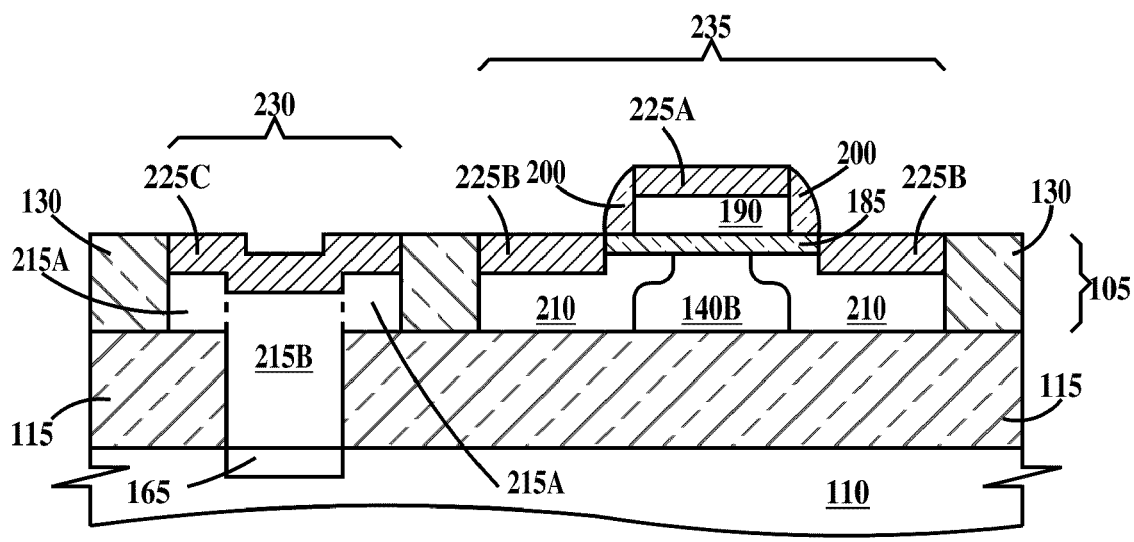

In FIG. 1L, a sintering anneal at temperature high enough to cause metal layer 220 (see FIG. 1K) react with silicon and form a metal silicide has been performed and any unreacted metal has been removed. The sintering forms metal silicide layer 225A on gate electrode 190, metal silicide layer 225B on source/drains 210, and metal silicide layer 225C on doped contact regions 215A and 215B. Thus a substrate contact 230 comprising silicide layer 225C, doped contact regions 215A and 215B and optional enhanced contact region 165 and an FET 235 comprising silicon region 140B, source/drains 210, gate dielectric layer 185, gate electrode 190, metal silicide layers 225A and 225B have been fabricated simultaneously.

In FIG. 1J, the polysilicon portion of substrate contact 230 (i.e., doped contact region 215B) is not bounded on any sides by dielectric isolation 130. If, during the steps illustrated in FIG. 1C and described supra, opening 155B has been grossly misaligned so W4 or W5 was zero, then in FIG. 1J, the doped contact region 215B portion substrate contact 230 would not be bounded by dielectric isolation 130 on all sides but still be bounded by dielectric isolation 130 on at least one side.

The top view geometry of substrate contact can take many forms, some of which are illustrated in FIGS. 2, 3, 4 and 5 described infra.

Figure 2:
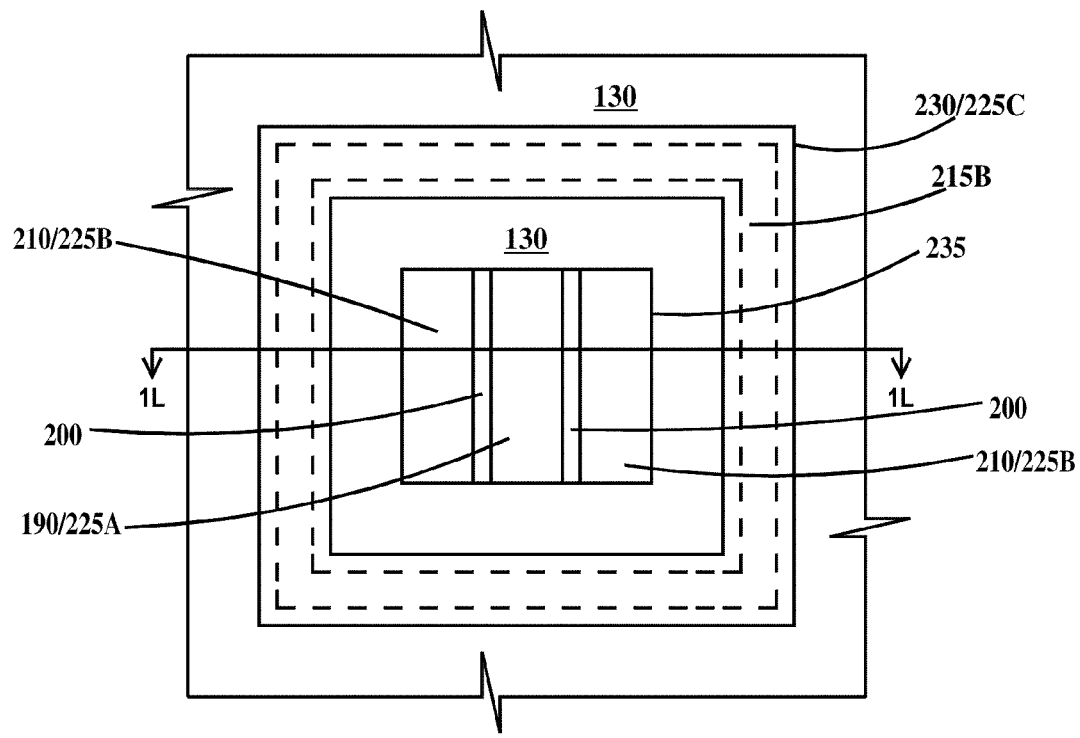
FIG. 2 is a top view of a first application of a substrate contact according to the embodiments of the present invention.

FIG. 2 is a top view of a first application of a substrate contact according to the embodiments of the present invention. FET 235 is surrounded on all sides by dielectric isolation 130. Substrate contact 230 is in the form of a ring between that region of dielectric isolation 130 abutting FET 235 and a field region of dielectric isolation 130 surrounding substrate contact 230 extending to other regions of an integrated circuit chip. Alternatively, FET 235 may be replaced by a multi-finger FET. A multi-finger FET has multiple contiguous sources, multiple contiguous drains and multiple contiguous gate electrodes.

Figure 3:
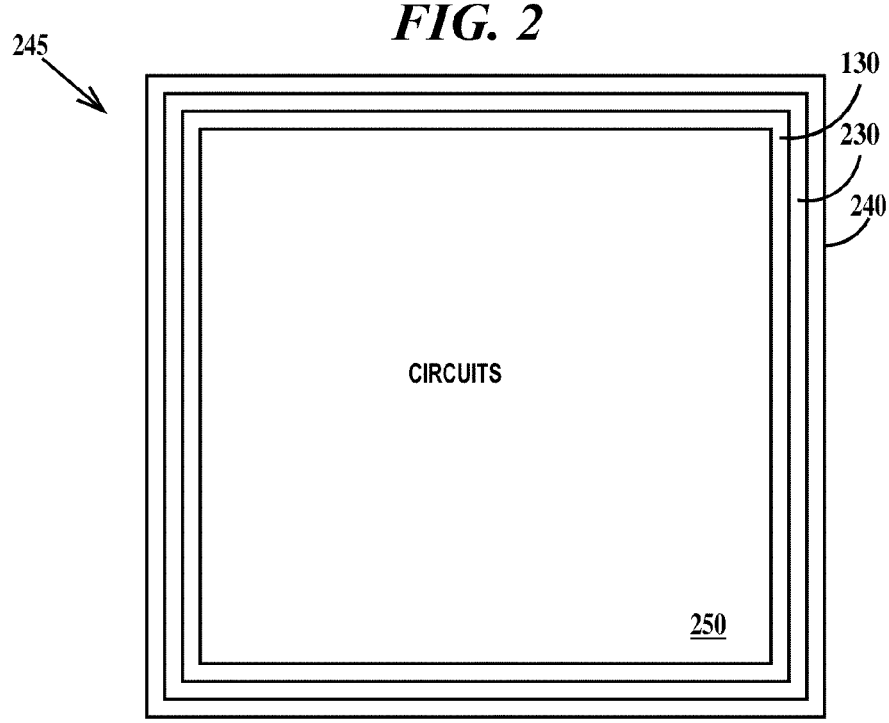
FIG. 3 is a top view of a second application of a substrate contact according to the embodiments of the present invention.

FIG. 3 is a top view of a second application of a substrate contact according to the embodiments of the present invention. In FIG. 3, substrate contact is in the faun of a ring adjacent to periphery 240 of an integrated circuit chip 240. A circuit region 245 is completely surrounded by substrate contact 230.

Figure 4:
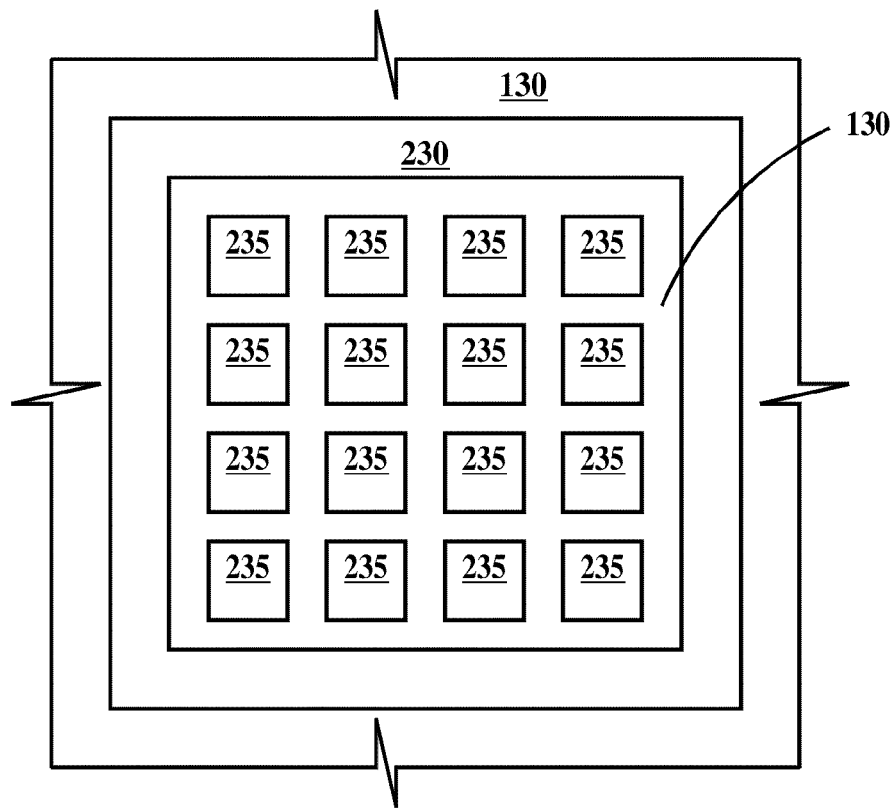
FIG. 4 is a top view of a third application of a substrate contact according to the embodiments of the present invention.

FIG. 4 is a top view of a third application of a substrate contact according to the embodiments of the present invention. FIG. 4 is similar to FIG. 2, except instead of a single FET 235, multiple FETs 235 are surrounded by ring shaped substrate contact 230.

Figure 5:
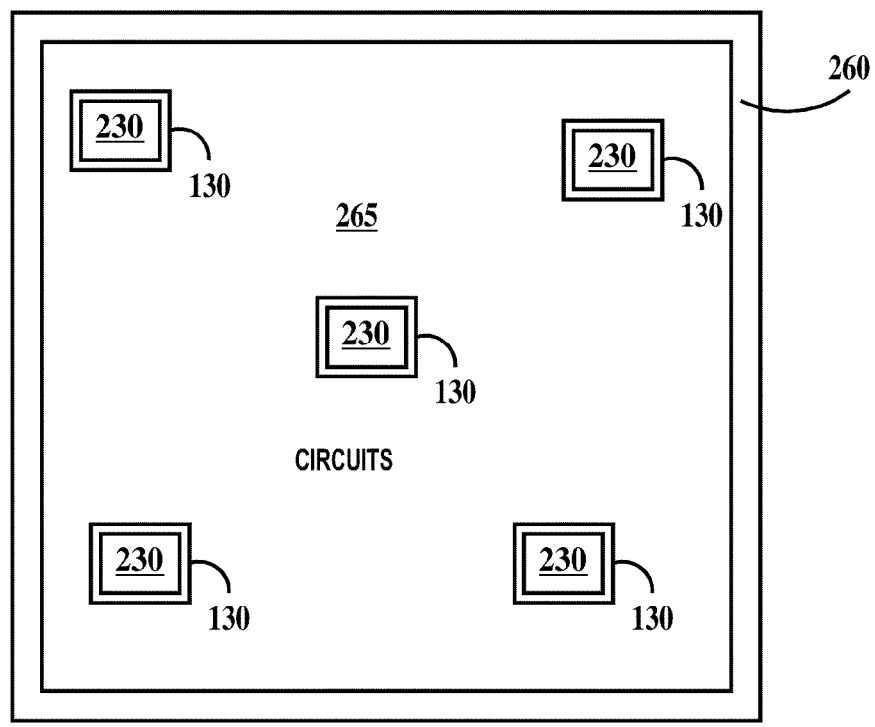
FIG. 5 is a top view of a fourth application of a substrate contact according to the embodiments of the present invention.

FIG. 5 is a top view of a fourth application of a substrate contact according to the embodiments of the present invention. In FIG. 5, an integrated circuit chip 255 includes a kerf region 260 and a circuit region 265. Positioned with circuit region 265 are multiple discrete substrate contacts 230.

It should be understood that a single integrated circuit chip can include one to all and any combination of contacts 230 having the top view geometries illustrated in FIGS. 2, 3, 4 and 5.

Figure 6:
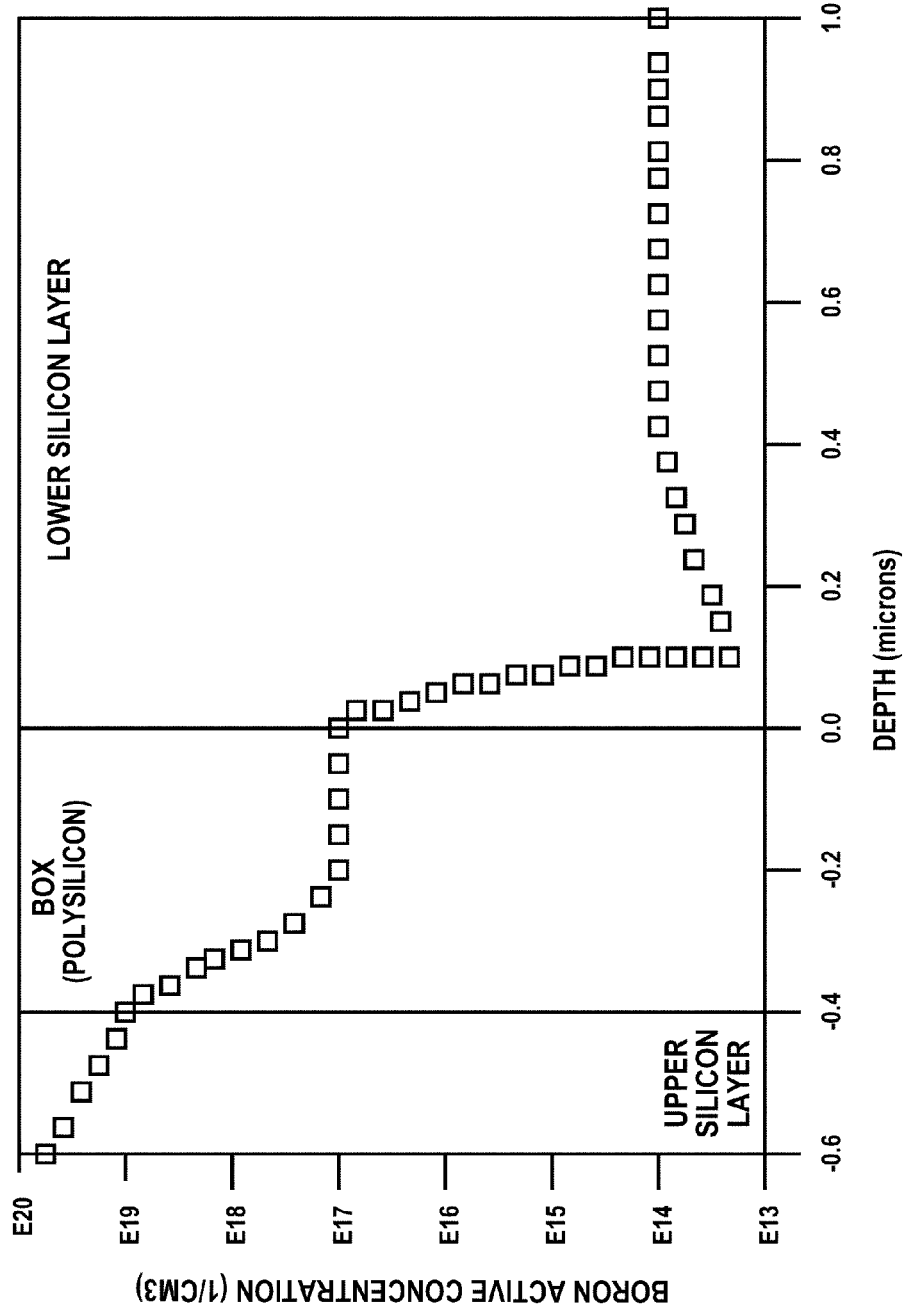
FIG. 6 is a plot of dopant concentration versus depth for substrate contact fabricated according to a first embodiment of the present invention.
Figure 7:
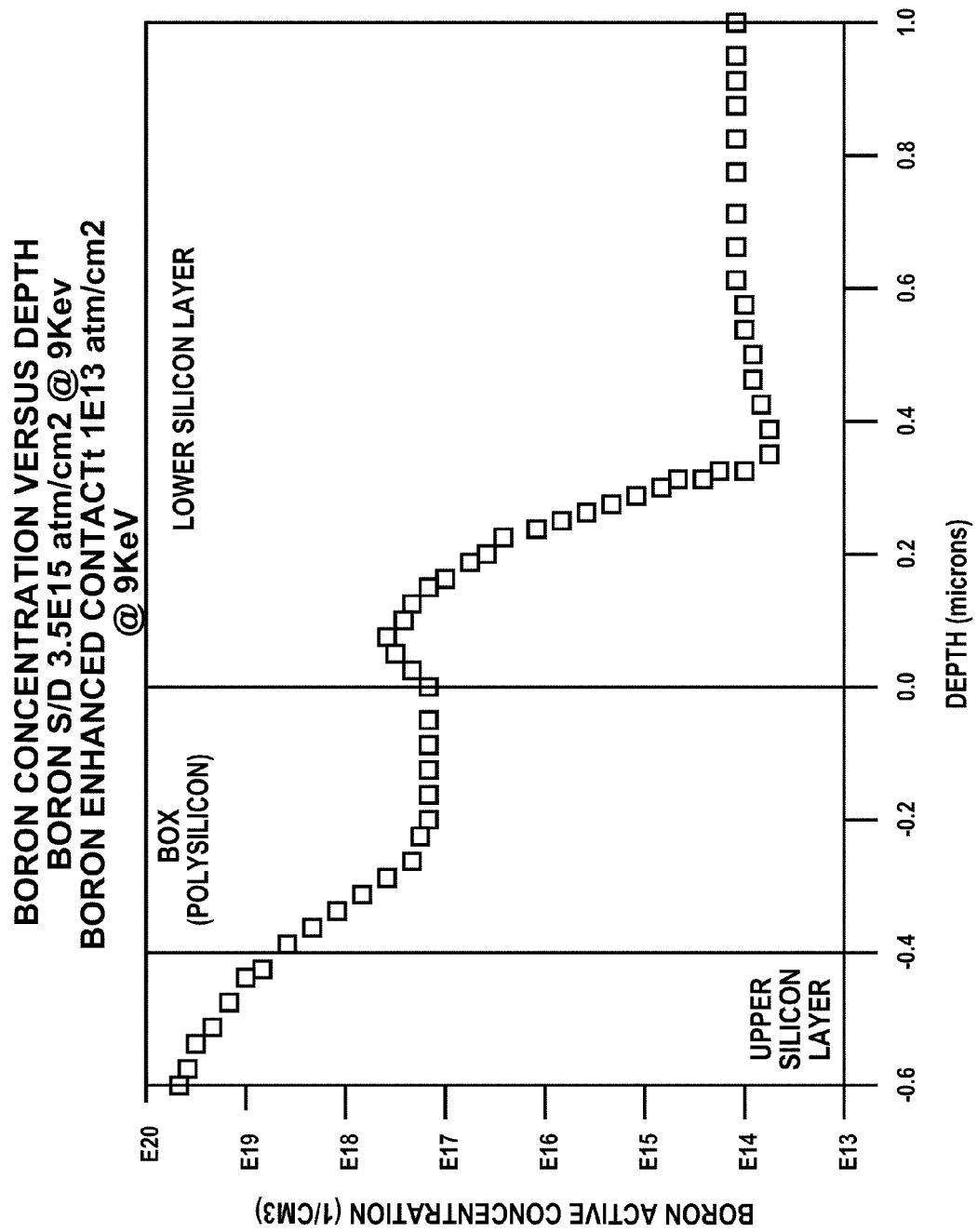
FIG. 7 is a plot of dopant concentration versus depth for substrate contact fabricated according to a second embodiment of the present invention.
Figure 8:
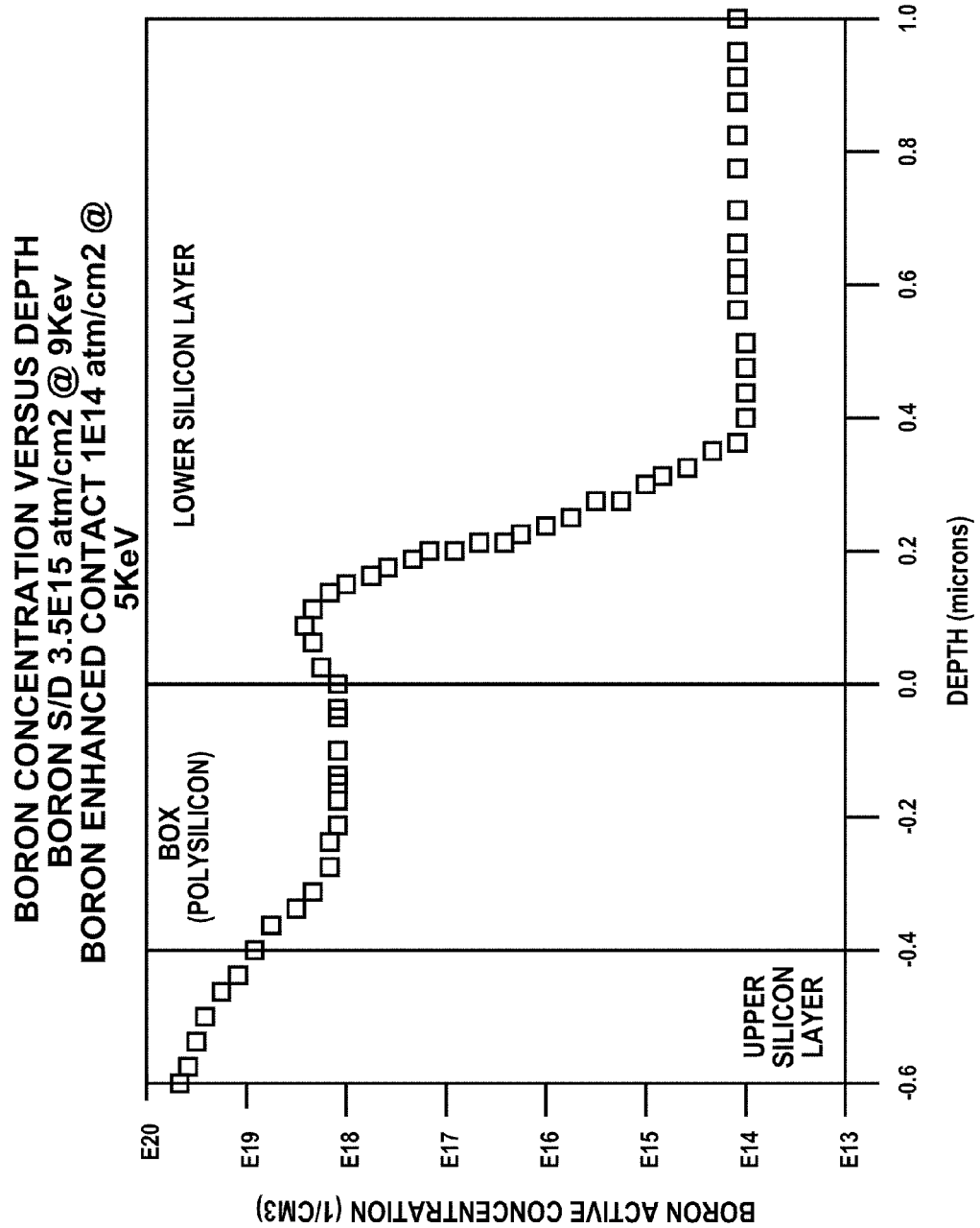
FIG. 8 is a plot of dopant concentration versus depth for substrate contact fabricated according to a third embodiment of the present invention.

FIGS. 6, 7, and 8, are simulation of a doping profile of substrate contact 230 (see FIG. 1J) assuming a P-type lower silicon layer, an upper silicon layer 0.2 microns thick and a BOX layer 0.4 microns thick under the ion implantation options indicated for each figure. In one example, the lower silicon layer has a high resistivity (i.e., greater than about 200 ohm-cm). In FIGS. 6, 7 and 8, the region labeled BOX is for reference only, and that the actual material in that region is the polysilicon of the substrate contact (see for example, FIGS. 1H and 1I). For purposes of the simulations in illustrated in FIGS. 6, 7 and 8, the thickness of the polysilicon portion of the substrate contact is roughly the same as the thickness of the BOX layer. In FIGS. 6, 7 and 8, it is useful to keep in mind that a doping concentration of $1E14$ atm/cm$^3$ is about equivalent to a resistivity of 200 ohm-cm, a doping concentration of $1E15$ atm/cm$^3$ is about equivalent to a resistivity of 10 ohm-cm, a doping concentration of $1E16$ atm/cm$^3$ is about equivalent to a resistivity of 1 ohm-cm a doping concentration of $1E17$ atm/cm$^3$ is about equivalent to a resistivity of 0.3 ohm-cm, a doping concentration of $1E18$ atm/cm$^3$ is about equivalent to a resistivity of 0.05 ohm-cm, and a doping concentration of $1E20$ atm/cm$^3$ is about equivalent to a resistivity of 0.001 ohm-cm. FIGS. 6, 7 and 8 are log-linear plots (depth is linear).

FIG. 6 is a plot of dopant concentration versus depth for substrate contact fabricated according to a first embodiment of the present invention. In FIG. 6, boron concentration versus depth from the BOX/lower silicon layer interface is plotted with only a boron source drain ion implant of $3.5E15$ atm/cm$^2$ at 9 KeV into the top of substrate contact. The dopant concentration at the polysilicon/lower silicon layer interface (indicated by the line between the BOX region and LOWER SILICON region of the plot results in a resistivity of about 0.1 ohm-cm to about 20 ohm-cm which may be too high for some applications, but if the BOX layer thickness is reduced to about 0.1 micron the resistivity would improve to about 0.05 ohm-cm. Thus, the need for the enhanced contact ion implantation 160 of FIG. 1D is reduced or eliminated.

FIG. 7 is a plot of dopant concentration versus depth for substrate contact fabricated according to a second embodiment of the present invention. In FIG. 7, boron concentration versus depth from the BOX/lower silicon layer interface is plotted with a boron source drain ion implant of $3.5E15$ atm/cm$^2$ at 9 KeV and an additional enhanced contact ion implant of $1E13$ atm/cm2 at 9 KeV into the substrate contact. The dopant concentration in the lower silicon layer region of the plot results in a resistivity of about 0.05 ohm-cm in the substrate, but still relatively high in the polysilicon/lower silicon interface region of the substrate contact.

FIG. 8 is a plot of dopant concentration versus depth for substrate contact fabricated according to a third embodiment of the present invention. In FIG. 8, boron concentration versus depth from the BOX/lower silicon layer interface is plotted with a boron source drain ion implant of $3.5E15$ atm/cm$^2$ at 9 KeV and an enhanced contact ion implant of $1E14$ atm/cm2 at 5 KeV into the substrate contact. The dopant concentration in the lower silicon region of the plot results in a resistivity of less than 0.05 ohm-cm in the substrate and a resistivity of about 0.05 at the polysilicon/lower silicon interface of the substrate contact would be generally acceptable values. Thus it is advantageous to adjust the enhanced contact ion implant dose and energy to match the thickness of the BOX layer.

Figure 9:
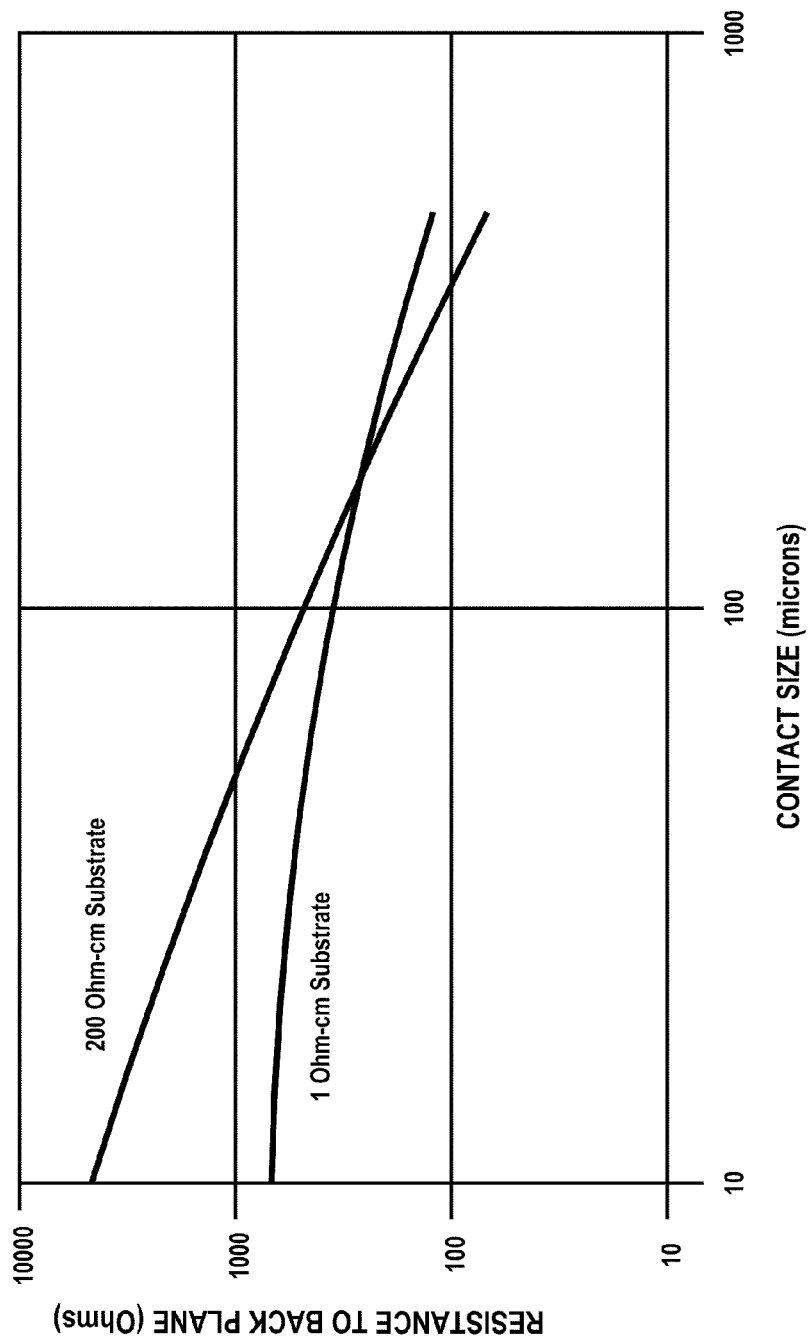
FIG. 9 is a plot of substrate contact size versus resistance as a function of the resistivity of the substrate.

FIG. 9 is a plot of substrate contact size versus resistance as a function of the resistivity of the substrate. FIG. 9 is a log-log plot. In FIG. 9, a square contact is assumed and the x-axis is a width of the contact. A feature of the substrate contact according to the embodiments of the present invention is the large surface area of the contact at the top of the contact (see FIG. 1L, silicide layer 225C). Assuming in FIG. 1B that the W4+W5=W3 and W3=10 microns, then the area of a substrate contact using only polysilicon would be 100 microns square but the area of a substrate contact using both the polysilicon and surrounding upper silicon layer would be 400 microns square. From FIG. 4 it can be seen, that for a 200 ohm-cm substrate a 100 square micron contact (with no ion implantations) would have a resistance of about 500 ohms while a 400 square micron contact would have a resistance of about 100 ohms. Therefore the substrate contacts according to the embodiments of the present invention provide an improvement in resistance due to horizontal geometry as well as vertical ion implantation profiles.

Thus the embodiments of the present invention, by providing a non-critical alignment process, improved doping profiles, and large contact area overcome the deficiencies and limitations described hereinabove.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
    dielectric isolation in an upper silicon layer of a substrate, said substrate comprising a buried oxide layer between said upper silicon layer and a lower silicon layer, said dielectric isolation coplanar with and extending from a top surface of said upper silicon layer to said buried oxide layer, said dielectric isolation completely surrounding a perimeter of a contact region;
    a polysilicon region extending through said contact region and through said buried oxide layer to said lower silicon layer, said contact region completely surrounding a perimeter of said polysilicon region, said polysilicon region doped a same dopant type as said lower silicon layer; and
    a contiguous metal silicide layer in remaining portions of said contact region and said polysilicon region, said metal silicide layer extending from a top surface of said polysilicon region into said polysilicon region and extending from a top surface of said remaining portions of said contact region into said remaining portions of said contact region.

2. The structure of claim 1, further including:
    an enhanced contact region in said lower silicon layer, abutting a bottom of said polysilicon region, said enhanced contact region doped said same dopant type as said lower silicon layer.

3. The structure of claim 2, wherein an interface between said polysilicon region and said lower silicon layer has a resistivity of about 0.05 ohm-cm or less.

4. The structure of claim 1, further including:
    a top surface of said polysilicon region recessed below a top surface of said dielectric isolation.

5. The structure of claim 1, wherein said lower silicon layer and said upper silicon layer are doped P-type.

6. The structure of claim 1, wherein a width of said polysilicon region measured in a direction parallel to a top surface of said upper silicon layer is less than a width of said contact region measured in said direction parallel to a top surface of said upper silicon layer.

7. The structure of claim 1, wherein a ratio of (i) a total thickness of said polysilicon region measured in a direction perpendicular to said top surface of said upper silicon layer to (ii) a width of said polysilicon region measured in a direction parallel to said top surface of said upper silicon layer is equal to or greater than about 3.

8. The structure of claim 1, wherein said polysilicon region does not physically contact said dielectric isolation.

9. The structure of claim 1, wherein at least a portion of said contact region intervenes between said dielectric isolation and said polysilicon region.

10. The structure of claim 1, wherein said contact region is in the form of a first ring surrounded by said dielectric isolation and said polysilicon region is in the form of a second ring within said first ring.

\* \* \* \* \*